United States Patent
Fukutani et al.

(10) Patent No.: US 12,500,013 B2
(45) Date of Patent: Dec. 16, 2025

(54) THERMISTOR

(71) Applicant: Murata Manufacturing Co., Ltd., Nagaokakyo (JP)

(72) Inventors: Tatsuya Fukutani, Nagaokakyo (JP); Hiroaki Ide, Nagaokakyo (JP); Shuichi Funahashi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 468 days.

(21) Appl. No.: 18/065,125

(22) Filed: Dec. 13, 2022

(65) Prior Publication Data

US 2023/0112895 A1    Apr. 13, 2023

Related U.S. Application Data

(63) Continuation of application No. PCT/JP2021/005925, filed on Feb. 17, 2021.

(30) Foreign Application Priority Data

Jun. 26, 2020 (JP) ................. 2020-110348

(51) Int. Cl.
H01C 7/04 (2006.01)
H01C 1/01 (2006.01)
H01C 1/14 (2006.01)

(52) U.S. Cl.
CPC ............ H01C 7/041 (2013.01); H01C 1/01 (2013.01); H01C 1/1413 (2013.01)

(58) Field of Classification Search
CPC ......... H01C 7/041; H01C 1/01; H01C 1/1413
See application file for complete search history.

(56) References Cited

U.S. PATENT DOCUMENTS 4,808,326 A * 2/1989 Tanino ............... H01F 1/37
428/407
5,916,834 A * 6/1999 Terashi ............... C04B 35/16
501/134

(Continued)

FOREIGN PATENT DOCUMENTS

EP    2833373 A1    2/2015
JP    2000-266608 A    9/2000

(Continued)

OTHER PUBLICATIONS

International Search Report in PCT/JP2021/005925, mailed on May 11, 2021, 3 pages.

*Primary Examiner* — Kyung S Lee
(74) *Attorney, Agent, or Firm* — ArentFox Schiff LLP

(57) ABSTRACT

A thermistor that includes: a base layer containing a resin component; a thermistor layer on the base layer, wherein the thermistor layer is a composite which includes a plurality of particles including a metal oxide containing at least one first metal element that is at least one of Mn and Ni, and an amorphous phase between the plurality of particles and which contains the same metal element as the first metal element; two electrodes, wherein the two electrodes include at least one second metal element selected from the group consisting of Cu, Al, Ag, and Ni; and a bonding layer between the two electrodes and the thermistor layer, the bonding layer comprising the composite, the second metal element, and the resin component.

17 Claims, 6 Drawing Sheets

(56) References Cited

U.S. PATENT DOCUMENTS

| | | | |
|---|---|---|---|
| 6,329,058 B1 * | 12/2001 | Arney | C09C 1/3684 |
| | | | 428/405 |
| 9,978,484 B2 | 5/2018 | Tanaka et al. | |
| 11,532,410 B2 | 12/2022 | Fujita et al. | |
| 11,607,728 B2 * | 3/2023 | Funahashi | C04B 35/2666 |
| 2002/0094929 A1 * | 7/2002 | Kawai | C03C 14/004 |
| | | | 501/32 |
| 2012/0188051 A1 | 7/2012 | Miura | |
| 2013/0288091 A1 | 10/2013 | Tsubaki et al. | |
| 2015/0071326 A1 | 3/2015 | Nagatomo et al. | |
| 2015/0092820 A1 | 4/2015 | Tanaka et al. | |
| 2015/0211940 A1 | 7/2015 | Miura et al. | |
| 2018/0164162 A1 | 6/2018 | Hioki et al. | |
| 2019/0260018 A1 * | 8/2019 | Matsuyama | H01M 10/0525 |
| 2020/0020467 A1 | 1/2020 | Rentrop et al. | |
| 2020/0139441 A1 | 5/2020 | Funahashi | |
| 2021/0074453 A1 | 3/2021 | Fujita et al. | |

FOREIGN PATENT DOCUMENTS

| | | | |
|---|---|---|---|
| JP | 2018151227 A | 9/2018 | |
| JP | 2018169248 A | 11/2018 | |
| JP | 2019096805 A | 6/2019 | |
| JP | 2019-114779 A | 7/2019 | |
| JP | 2019138798 A | 8/2019 | |
| JP | 2020510200 A | 4/2020 | |
| WO | 2011024724 A1 | 3/2011 | |
| WO | 2017022373 A1 | 2/2017 | |
| WO | 2019009320 A1 | 1/2019 | |

* cited by examiner

THERMISTOR

CROSS REFERENCE TO RELATED APPLICATIONS

The present application is a continuation of International application No. PCT/JP2021/005925, filed Feb. 17, 2021, which claims priority to Japanese Patent Application No. 2020-110348, filed Jun. 26, 2020, the entire contents of each of which are incorporated herein by reference.

FIELD OF THE INVENTION

The present invention relates to a thermistor, more particularly a thermistor in which a structure including a thermistor layer and two electrodes is disposed on a base layer.

BACKGROUND OF THE INVENTION

Conventionally, various thermistors, so-called thin-film thermistors, in which a structure including a thermistor layer and two electrodes is disposed on a base layer (substrate) are known (see, for example, Patent Documents 1 to 4).

More specifically, Patent Document 1 discloses a thermistor including a metal substrate, a thermistor layer formed from a metal oxide and formed on the metal substrate, and a pair of split electrodes formed on the thermistor layer. Patent Documents 2 to 4 disclose a thermistor in which a thermistor layer formed from a metal nitride and a pair of comb-shaped counter electrodes are formed on an insulating substrate which is a resin film in this order or in the reverse order.

Patent Document 1: WO 2011/024724 A
Patent Document 2: Japanese Patent Application Laid-Open No. 2019-138798
Patent Document 3: Japanese Patent Application Laid-Open No. 2019-96805
Patent Document 4: Japanese Patent Application Laid-Open No. 2018-169248

SUMMARY OF THE INVENTION

As the material of the thermistor layer, a metal nitride can be formed at room temperature by sputtering (see Patent Documents 2 to 4); however, bonding strength between the thermistor layer (metal nitride) formed by sputtering and the electrode is not necessarily sufficient. On the other hand, the metal oxide requires sintering at a high temperature of 900° C. or higher in a conventional general forming method (see Patent Document 1), and due to a difference in thermal expansion coefficient between the thermistor layer (metal oxide) and the electrode, it is difficult to obtain high bonding strength between the thermistor layer and the electrode.

An object of the present invention is to achieve a thermistor which uses, as a thermistor layer, a composite which contains a plurality of particles formed from a metal oxide and in which a metal element in the metal oxide contains at least one of Mn and Ni, and in which high bonding strength is obtained between the thermistor layer and an electrode.

According to a first gist of the present invention, there is provided a thermistor that includes: a base layer containing a resin component; a thermistor layer on the base layer, wherein the thermistor layer is a composite which includes a plurality of particles including a metal oxide containing at least one first metal element that is at least one of Mn and Ni, and an amorphous phase between the plurality of particles and which contains the same metal element as the first metal element; two electrodes, wherein the two electrodes include at least one second metal element selected from the group consisting of Cu, Al, Ag, and Ni; and a bonding layer between the two electrodes and the thermistor layer, the bonding layer comprising the composite, the second metal element, and the resin component.

According to a second gist of the present invention, there is provided a thermistor that includes: a base layer containing a resin component; a thermistor layer on the base layer, wherein the thermistor layer comprises a composite which includes a plurality of particles including a metal oxide containing at least one first metal element that is at least one of Mn and Ni, and an amorphous phase between the plurality of particles and contains the same metal element as the first metal element; two electrodes, wherein the two electrodes include a base material including at least one second metal element selected from the group consisting of Cu, Al, Ag, and Ni; and a coating layer on a surface of the base material, the coating layer including at least one third metal element selected from the group consisting of Ni, Au, Ag, Pt, Pd, Zn, Cr, W, Mo, Cu, and Ti.

According to one aspect of the second gist of the present invention, the thermistor further includes a bonding layer between the two electrodes and the thermistor layer, the bonding layer comprising the composite, the third metal element, and the resin component.

According to another aspect of the second gist of the present invention, the thermistor further includes a bonding layer between the two electrodes and the thermistor layer, the bonding layer comprising the composite, the second metal element, the third metal element, and the resin component.

In the first and second gist's of the present invention, a structure comprising the thermistor layer and the two electrodes defines two surfaces that face each other, and the two surfaces may have irregularities smaller than a thickness of the two electrodes or the two surfaces may be flat.

In the first and second gist's of the present invention, the two electrodes may be arranged on the base layer to be spaced apart from each other, and the thermistor layer may be disposed on the two electrodes and the base layer.

In the first and second gist's of the present invention, the first metal element may further include at least one selected from the group consisting of Fe, Al, Co, and Cu.

In the first and second gist's of the present invention, the resin component may contain at least one selected from the group consisting of polyethylene terephthalate, polyetherimide, polyamideimide, polyimide, polytetrafluoroethylene, an epoxy resin, and a liquid crystal polymer.

According to the present invention, a thermistor in which a composite (the metal element in the metal oxide contains at least one of Mn and Ni) containing a plurality of particles including a metal oxide is used as a thermistor layer, and high bonding strength is obtained between the thermistor layer and an electrode is achieved.

BRIEF EXPLANATION OF THE DRAWINGS

FIGS. 1(a) and 1(b) are views for explaining a thermistor in one embodiment of the present invention, wherein FIG. 1(a) shows a schematic sectional view of the thermistor, and FIG. 1(b) shows a schematic sectional view in which a region Z surrounded by a one-dot chain line in FIG. 1(a) is enlarged.

FIGS. 3(a) and 3(b) are views for explaining one example of the thermistor in one embodiment of the present invention, wherein FIG. 3(a) shows a schematic sectional view taken along line X-X in FIG. 3(b), and FIG. 3(b) shows a schematic top view.

FIGS. 4(a) and 4(b) are views for explaining a thermistor in another embodiment of the present invention, wherein FIG. 4(a) shows a schematic sectional view of the thermistor, and FIG. 4(b) shows a schematic sectional view in which a region Z surrounded by a one-dot chain line in FIG. 4(a) is enlarged.

FIGS. 5(a) and 5(b) are views for explaining thermistor samples prepared in Examples 1 to 3 and Comparative Example 2, wherein FIG. 5(a) is a top view for explaining a pair of electrodes and an extraction electrode, and FIG. 5(b) is a top view for explaining a thermistor layer (indicated by hatched lines in the drawing).

DETAILED DESCRIPTION OF THE INVENTION

Figure 1A:
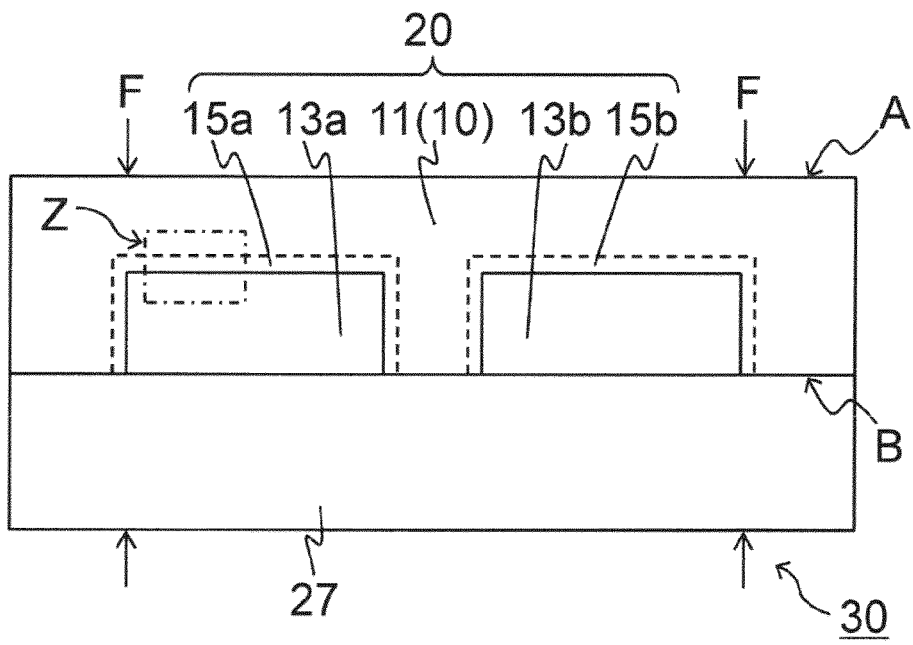

Hereinafter, thermistors according to two embodiments of the present invention will be described with reference to the drawings. In the drawings, the same members are denoted by the same reference numerals, and the same description applies unless otherwise specified.

Embodiment 1

The present embodiment relates to a thermistor in which two electrodes are formed from a second metal element.

Figure 1B:
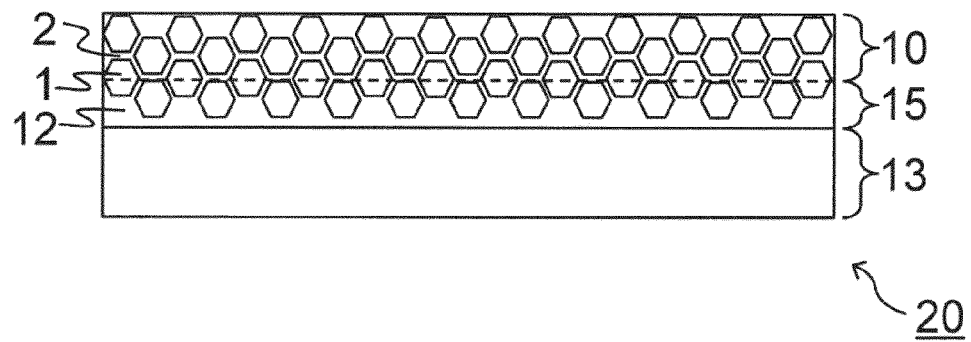

As shown in FIGS. 1(a) and 1(b), in a thermistor 30 in the present embodiment, a structure 20 including a thermistor layer 11 and two electrodes 13a and 13b (collectively referred to as reference numeral "13") is disposed on a base layer 27.

The base layer 27 may contain a resin component. The resin component is not particularly limited, and may contain at least one selected from the group consisting of polyethylene terephthalate, polyetherimide, polyamideimide, polyimide, polytetrafluoroethylene, an epoxy resin, and a liquid crystal polymer (LCP). Among these components, polyimide and polyamideimide are preferable from the viewpoint of heat resistance and adhesion. The base layer 27 can be, for example, a resin substrate (resin film) containing such a resin component. In the present embodiment, the base layer 27 is an insulating substrate.

Figure 2:
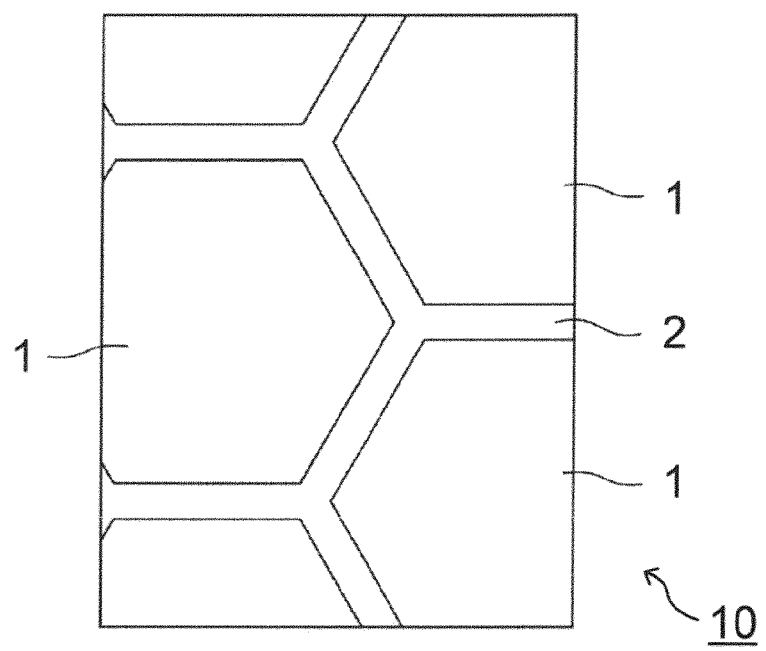
FIG. 2 is a view for explaining the thermistor in one embodiment of the present invention, and is a partial schematic view showing a structure of a composite constituting a thermistor layer.

As shown in FIGS. 1(b) and 2, the thermistor layer 11 is a composite (hereinafter, also referred to as a "metal oxide-containing composite") 10 including a plurality of particles (hereinafter, also simply referred to as "metal oxide particles") 1 including a metal oxide containing at least one first metal element, and an amorphous phase (hereinafter, also referred to as a "first amorphous phase") 2 existing between the plurality of particles 1 and containing the same metal element as the first metal element.

The metal oxide constituting the metal oxide particles 1 contains at least one of Mn and Ni as the first metal element, and may further contain at least one selected from the group consisting of Fe, Al, Co, and Cu. Mn and/or Ni are essential metal elements in the metal oxides. At least one selected from the group consisting of Fe, Al, Co, and Cu is an optionally added metal element in the metal oxide. The optionally added metal element is preferably at least one selected from the group consisting of Fe, Al, and Co. Any of these metal oxides may be a metal oxide semiconductor, and may particularly have a spinel-type structure, but the present invention is not limited thereto.

The proportion of the metal element in the entire metal oxide constituting the plurality of metal oxide particles 1 is not particularly limited, and can be appropriately selected according to desired electrical characteristics and the like. With respect to the essential metal elements, when both Mn and Ni exist, a ratio (atomic ratio) of Mn:Ni may be, for example, 1 to 100:1. When the optionally added metal element exist, the optionally added metal element (the total of the optionally added metal elements when a plurality of the optionally added metal elements exist) may be less than the essential metal element (the total of Mn and Ni when both Mn and Ni exist), and a ratio (atomic ratio) of the essential metal element:the optionally added metal element may be, for example, 1 to 100:1.

An average particle size of the metal oxide particles 1 can be, for example, 0.01 μm to 100 μm, and particularly 0.02 μm to 1 μm. When the average particle size of the metal oxide particles 1 is in the range of 0.01 μm to 100 μm, the metal oxide particles are easily carried into gaps between other metal oxide particles by a liquid medium and/or a fluid (preferably a solvent) derived from metal acetylacetonate in the production method described later in the present embodiment, and densification of the composite obtained can be more effectively achieved. In the present specification, the average particle size is a particle size (D 50) at a point at which a cumulative value is 50% in a cumulative curve drawn by obtaining a particle size distribution on a volume basis and taking the whole to be 100%. The average particle size can be measured using a laser diffraction/scattering type particle size/particle size distribution measuring apparatus or an electron scanning microscope.

The metal oxide particles 1 may be a mixture of two or more kinds of metal oxide particles having different metal oxide compositions and/or average particle sizes.

The first amorphous phase 2 exists between the metal oxide particles 1, and can cause the metal oxide particles 1 to adhere to each other. Therefore, the composite 10 itself has high strength. Although the present embodiment is not limited, it is possible to form a structure in which the plurality of metal oxide particles 1 are dispersed in a continuous phase of the first amorphous phase 2. The composite 10 can contain the metal oxide particles 1 at a high density by the first amorphous phase 2 (a conductive path can be formed by the metal oxide particles 1 dispersed at a high density). In addition, the first amorphous phase 2 can exhibit electrical characteristics close to those of the metal oxide (semiconductor) particles 1 having a crystal structure. This makes it possible to obtain electrical characteristics similar to those of a sintered body obtained by sintering metal oxide particles at a high temperature by a conventional general method.

The first amorphous phase 2 contains the same metal element as the first metal element contained in the metal oxide particles 1. As a result, when mutual diffusion occurs between the metal oxide particles 1 and the first amorphous phase 2, it is possible to effectively prevent the electrical characteristics of the composite 10 from deteriorating.

In the present specification, the amorphous phase means a phase having substantially no crystallinity or a phase having a relatively low crystallinity, which can be distinguished and discriminated from particles having a crystal structure based on an electron beam diffraction image which is a technique known to those skilled in the art.

In the present embodiment, the existence of the first amorphous phase 2 between the metal oxide particles 1 can mean that the first amorphous phase 2 fills a space between the plurality of metal oxide particles 1. As a result, a pore that may be contained in the composite 10 can be eliminated by filling with the first amorphous phase 2, so that a change in resistance value before and after being left under a high-temperature and high-humidity environment, which is considered to be caused by the pore, can be reduced. When attention is paid to any two metal oxide particles 1 adjacent to each other among all the metal oxide particles 1, the first amorphous phase 2 may exist between the two metal oxide particles 1, or the two metal oxide particles 1 may be in contact with each other (the metal oxide particles are preferably bonded to each other) without substantially having the first amorphous phase 2 therebetween. In the former case, the first amorphous phase 2 may exist with a thickness of 100 μm or less. The thickness of the first amorphous phase 2 is preferably small from the viewpoint of electrical characteristics and/or strength. In the latter case described above, a portion where the first amorphous phase 2 is substantially absent may exist in the composite 10.

It should be noted that the composite 10 (in particular, the first amorphous phase 2) is substantially free of silicon oxide such as $SiO_2$ glass. Silicon oxide is not preferable because it causes significant deterioration in electrical characteristics. The content of the silicon oxide in the composite 10 (with respect to the total mass of the metal oxide particles) is, for example, 0.1% by mass or less, preferably 0.01% by mass or less, and more preferably substantially 0% by mass.

As described later, the composite 10 is obtained by heating (also referred to as firing, and may also be referred to as "sintering" when attention is paid to metal oxide particles) a raw material mixture (a mixture containing the metal oxide particles 1 and metal acetylacetonate) as a precursor of the composite at a temperature of 600° C. or lower under pressure. In other words, the composite 10 can be produced by low-temperature firing.

The two electrodes 13a and 13b are formed from at least one second metal element selected from the group consisting of Cu, Al, Ag, and Ni. When the electrode 13 is formed from two or more second metal elements, the electrode 13 may be an alloy. The second metal element is preferably any one of or two or more of Ni, Cu, and Ag. The second metal element is inexpensive and easily available as compared with Ag—Pd (obtained by mixing and sintering Ag particles and Pd particles) as described in Patent Document 1. According to the present embodiment, it is possible not to use metal species that are expensive and poor in resources. For example, Ag, Ni and the like can be used in the case of being subjected to a heat treatment at 600° C. or lower (co-sintering with a thermistor layer and annealing in the case of being performed), and Cu, Al, Ag, Ni and the like can be used in the case of being subjected to a heat treatment at 500° C. or lower. In the present specification, the term "co-sintering" means that a precursor (raw material mixture) of the thermistor layer is simultaneously subjected to heat treatment (firing) for sintering, and in the present embodiment, the base layer and the electrode are co-sintered with the thermistor layer.

In the present embodiment, as shown in FIGS. 1(a) and 1(b), bonding layers 15a and 15b (collectively referred to as reference numeral "15") exist between the two electrodes 13a and 13b and the thermistor layer 11 (composite 10). The bonding layer 15 is formed by diffusing the second metal element and the resin component into the composite 10. In practice, a boundary between the composite 10 and the bonding layer 15 is not necessarily clear (in the accompanying drawings, a virtual boundary is indicated by a dotted line). In some cases, the composite 10 and the bonding layer 15 may be collectively understood as a metal oxide-containing composite layer or thermistor layer. The composite 10 between the electrodes 13a and 13b, together with the bonding layers 15a and 15b, can act as a thermistor layer whose resistance can vary depending on temperature (more specifically with a negative temperature coefficient).

More specifically, the bonding layer 15 is formed by diffusing the second metal element derived from the electrode 13 and the resin component derived from the substrate 27 into the composite 10 (including the metal oxide particles 1 and the first amorphous phase 2). The second metal element can be diffused from the electrode 13 to the composite 10 by heat and dissolution (more specifically, dissolution of the metal element in metal acetylacetonate, which can occur during the application and heat treatment of a raw material mixture (mixture including metal oxide particles and metal acetylacetonate)) to form the bonding layer 15. The resin component can be diffused from the substrate 27 to the composite 10 by heat and dissolution (more specifically, dissolution of the resin component in metal acetylacetonate, which can occur during the application and heat treatment of a raw material mixture) to form the bonding layer 15. The second metal element and the resin component may diffuse into either the metal oxide particles 1 or the first amorphous phase 2, and may diffuse more into the first amorphous phase 2 in most cases. Since the first amorphous phase 2 contains the same metal element as the first metal element as described above, it can also be understood that in the bonding layer 15, the second amorphous phase 12 contains the same metal element as the first metal element, the same metal element as the second metal element, and the same element as the resin component (carbon element when the resin component contains carbon). The bonding layer 15 can be understood as a region in which the same metal element as the second metal element is distributed and the same element as the resin component (typically, carbon element) is distributed. Elements (particularly metal elements and carbon elements) contained in the thermistor layer and the bonding layer can be confirmed using a scanning transmission electron microscope (STEM) and/or energy dispersive X-ray spectrometry (EDX).

According to the thermistor 30 of the present embodiment, since the composite 10 that can be produced by low temperature firing is used for the thermistor layer 11, the base layer 27 and the electrodes 13a and 13b can be co-sintered with the thermistor layer 11 by heating the raw material mixture for obtaining the composite 10 together with the base layer 27 and the electrodes 13a and 13b, so that the bonding layers 15a and 15b in which the second metal element and the resin component are diffused into the composite are formed between the electrodes 13a and 13b and the thermistor layer 11. Due to the bonding layers 15a and 15b thus configured, high bonding strength can be obtained between the thermistor layer 11 (composite 10) and the electrodes 13a and 13b.

In the thermistor 30 of the present embodiment, the bonding layer 15 (more specifically, the second amorphous phase 12) contains the same metal element as the first metal element and the second metal element. In addition, the bonding layer 15 can exhibit electrical characteristics close to those of the metal oxide (semiconductor) particles 1 having a crystal structure. In addition, since the bonding layer 15 contains the same metal element as the first metal element and the second metal element, electrical resistance (schematically, a Schottky barrier between the metal oxide (semiconductor) particles 1 and the electrode 13, more specifically, interface resistance between the metal oxide particles 1 and the second amorphous phase 12 and between the second amorphous phase 12 and the electrode 13) between the composite 10, the bonding layer 15, and the electrode 13 can be reduced, and the electrical characteristics of the thermistor 30 can be improved.

In the thermistor 30 of the present embodiment, the composite 10 can contain the metal oxide particles 1 at a high density by the first amorphous phase 2, and the first amorphous phase 2 and the second amorphous phase 12 can exhibit electrical characteristics close to those of the metal oxide (semiconductor) particles 1; therefore, electrical characteristics similar to those of a sintered body obtained by sintering the metal oxide particles at a high temperature by a conventional general method can be obtained, and desired electrical characteristics (for example, thermistor characteristics, more specifically, room temperature resistivity, B constant, and the like) can be achieved. In the thermistor 30 of the present embodiment, the composite 10 is firmly bonded to the electrodes 13a and 13b via the bonding layers 15a and 15b, and high bonding strength can be achieved. In addition, due to the high bonding strength, the resistance value of the thermistor 30 varies little, and high reliability can be achieved. In short, initial characteristics of the thermistor 30 can be stabilized, and, in addition, the reliability of the thermistor 30 against environmental changes can be secured.

On the other hand, in a conventionally known thermistor (see, for example, Patent Document 1), a metal element can be diffused from an electrode by simple heat treatment; however, in this case, oxidation of the electrode occurs, so that thermistor characteristics may be deteriorated, and it is difficult to obtain high bonding strength due to a difference in thermal expansion coefficient between the electrode and the thermistor layer. On the other hand, the thermistor 30 of the present embodiment does not impair the thermistor characteristics and can obtain high bonding strength.

In the thermistor 30 of the present embodiment, the thickness of the structure 20 (including the thermistor layer 11 and the electrodes 13a and 13b) disposed on the base layer 27 may be, for example, 100 μm or less, and more specifically, may be 1 μm to 30 μm. The thermistor 30 is also referred to as a thin film thermistor. The thickness of the base layer 27 is not particularly limited, and may be, for example, 1 to 50 μm in the case of the thin film thermistor.

Since the thermistor 30 is thin as described above, the thermistor 30 can be easily installed in a small space. Further, it is possible to reduce physical damage due to pressurization at the time of attachment to both the thermistor 30 and an object to which the thermistor 30 is attached and at the time of operation. Furthermore, since the thermistor 30 has a small heat capacity, the thermistor 30 exhibits high temperature responsiveness. Since the composite 10 (and the bonding layers 15a and 15b) is thin and has flexibility, the composite 10 is hardly broken against deformation. In particular, when a flexible substrate (for example, a resin film) is used as the base layer 27, the thermistor 30 that is flexible as a whole can be obtained.

In the present embodiment, the structure 20 has two surfaces A and B (these surfaces may also face a main surface of the base layer 27) facing each other, and these two surfaces A and B have irregularities smaller than the thickness of the two electrodes 13a and 13b, or are preferably flat (FIG. 1(a) shows the case where these surfaces A and B are flat). In contrast to the base layer 27 containing a resin component, the structure 20 including the thermistor layer 11 that is a metal oxide-containing composite and the electrode 13 that is a metal is greatly different in material properties such as hardness and stress deformation, and has relatively high hardness. Since the surfaces A and B of the structure 20 have small irregularities or are more preferably flat, when sandwiching is performed between two objects having flat facing surfaces and a pressure F is applied in a thickness direction of the thermistor 30, the pressure is uniformly applied to the structure 20 and the base layer 27, and the thermistor characteristics are not impaired. In addition, when the thermistor 30 is used as a temperature sensor, an object to be measured for temperature (which may be any of the two objects) is hardly broken, and high pressure resistance is obtained. Although any one of the surfaces A and B of the structure 20 is brought into contact with the object to be measured for temperature, the surfaces A and B have small irregularities or are more preferably flat, so that a large contact area is obtained, and thermal responsiveness is excellent. Both high pressure resistance and thermal responsiveness can be achieved only by the structure 20 (when irregularities larger than the thickness of the electrode are provided, high pressure resistance and thermal responsiveness can be achieved without forming a resin layer in order to reduce the irregularities).

The thickness of the electrodes 13a and 13b is preferably more than 1 μm in order to effectively avoid disconnection of the electrodes. When the thickness of the electrode is minimum, the above-described effect may be minimized. However, for example, when the thermistor layer is about 1 to 10 μm, the size of irregularities that can exist on the two surfaces A and B is 1 μm or less, so that a sufficient effect can be obtained in terms of pressure resistance and thermal responsiveness.

On the other hand, a conventionally known thermistor (see, for example, Patent Documents 1, 3, and 4) has relatively large irregularities on a surface of a structure including an electrode and a thermistor layer. When the pressure F is applied in the thickness direction of such a thermistor while sandwiching is performed between two objects having flat facing surfaces, a load is concentrated on the electrode and/or the thermistor layer having high hardness and small elastic deformation, and thermistor characteristics may be impaired. In addition, when the thermistor is used as a temperature sensor, there is a risk that the object to be measured for temperature may be broken. In addition, when there are relatively large irregularities on the surface of the structure, an air layer is formed, a contact area with the object to be measured for temperature is reduced, and the thermal responsiveness may be deteriorated. Although such a countermeasure for filling relatively large irregularities with a resin is conceivable, the resin generally becomes thermal resistance, and there is a concern that the thermal responsiveness is impaired. On the other hand, the thermistor 30 of the present embodiment can obtain high pressure resistance and thermal responsiveness.

In the thermistor 30 of the present embodiment, the arrangement of the thermistor layer 11 and the two electrodes 13a and 13b is not particularly limited; however, as shown in FIG. 1(a), the two electrodes 13a and 13b may be arranged on the base layer 27 to be spaced apart from each other, and the thermistor layer 11 may be disposed on the two electrodes 13a and 13b and the base layer 27. The number of electrodes is not limited to two, and three or more electrodes may exist in some cases.

Figure 3A:
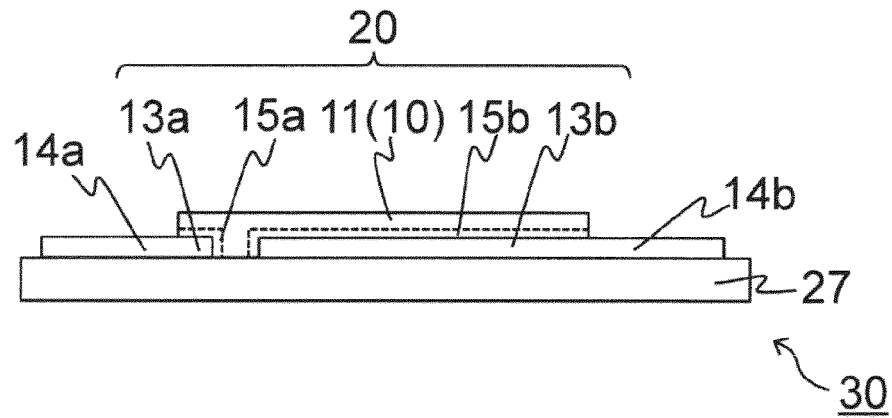
Figure 3B:
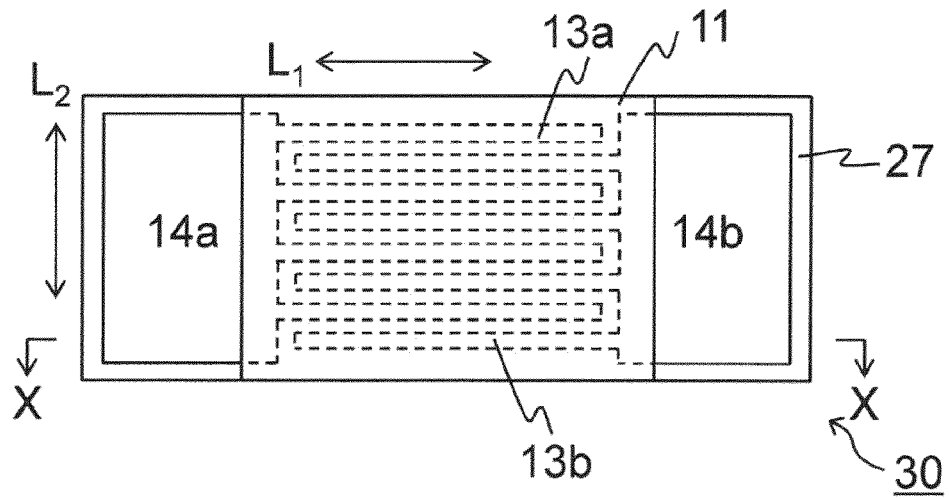

In one example of the thermistor 30 of the present embodiment, the electrodes 13a and 13b may be comb-shaped counter electrodes formed on the base layer 27 as shown in FIG. 3(b). In FIG. 3(b), the electrodes 13a and 13b located below the thermistor layer 11 are shown in a perspective view, and the bonding layers 15a and 15b are omitted. As a result, the electrical characteristics of the thermistor 30 can be controlled (for example, variation in resistance value can be further reduced), and high temperature resolution can be achieved. In such an example of the thermistor 30, the two electrodes 13a and 13b may be electrically connected to the two external electrodes 14a and 14b, respectively. In this example, by forming a comb-shaped counter electrode on the base layer 27 which is an insulating substrate, a gap is formed in a planar direction (direction parallel to the main surface of the base layer 27) between the counter electrodes. In the example shown in FIG. 3(b), although the external electrodes 14a and 14b are provided on both outer sides (both outer sides in a tooth length direction $L_1$) of the pair of comb-shaped counter electrodes 13a and 13b, extraction electrodes extending along a tooth width direction $L_2$ may be formed on both outer sides of the pair of comb-shaped counter electrodes 13a and 13b.

The thermistor 30 of the present embodiment described above can be manufactured by any suitable method, and can be manufactured, for example, by the following method.

First, the electrodes 13a and 13b formed from the second metal element are formed on the base layer 27. The electrodes 13a and 13b can be pattern-formed by any suitable method such as photolithography, plating, vapor deposition, or sputtering. Alternatively, a paste containing particles of the second metal element may be used to form precursors of the electrodes 13a and 13b, and then fired simultaneously with a precursor of the thermistor layer 11.

Next, a mixture (hereinafter, also referred to as "raw material mixture" in the present specification) containing the metal oxide particles 1 and the metal acetylacetonate is applied to a predetermined region (region where the composite 10 and the bonding layers 15a and 15b, in other words, the metal oxide-containing composite layer is to be formed) of the base layer 27 on which the electrodes 13a and 13b (or precursors thereof) are formed as described above, and the mixture is heated under pressure at a temperature of a melting point of the metal acetylacetonate or higher and 600° C. or lower, whereby the composite 10 and the bonding layers 15a and 15b (and the electrodes 13a and 13b in the case of co-firing) are simultaneously and integrally formed in the form of a sintered body containing the metal oxide particles 1.

The raw material mixture can be applied (for example, coating, printing (screen printing, etc.)) to a predetermined region by a method known to those skilled in the art, for example, by coating, dipping, lamination, spraying, or the like. The base layer to which the raw material mixture is applied can be subjected to a treatment such as drying under heating or natural drying as necessary, and then heating can be performed under pressure at a temperature of the melting point of the metal acetylacetonate or higher and 600° C. or lower using means known to those skilled in the art such as a pressing machine.

In the present specification, the metal acetylacetonate is an acetylacetonate salt of a metal, and more specifically, is a chelate complex having an acetylacetonate ion $((CH_3COCHCOCH_3)-$, hereinafter also abbreviated as (acac)-) of a bidentate ligand and a central metal. The metal element contained in the metal acetylacetonate is any one or two or more elements selected from the first metal element, and is preferably the same metal element as the first metal element contained in the metal oxide particles 1, but the present invention is not limited thereto.

As the metal acetylacetonate, one kind of metal acetylacetonate may be used, or two or more kinds of metal acetylacetonates may be used in combination. When there are two or more of the first metal elements contained in the metal oxide particles 1, two or more kinds of metal acetylacetonates may be used in combination according to an existence ratio of these metal elements, but the present invention is not limited thereto.

A raw material mixture is obtained by mixing the metal oxide particles and the metal acetylacetonate. The metal oxide particles and the metal acetylacetonate can be mixed in an atmosphere at normal temperature and normal humidity under atmospheric pressure. The metal acetylacetonate may be mixed at a ratio of, for example, 0.1% by mass to 50% by mass, and is mixed at a ratio of preferably 1% by mass to 30% by mass, and more preferably 2% by mass to 10% by mass, with respect to the total mass of the metal oxide particles.

As the metal acetylacetonate to be mixed, a metal acetylacetonate in an arbitrary state may be used. For example, the raw material mixture may be obtained by mixing metal oxide particles and a dried powdery solid metal acetylacetonate. In this case, a raw material mixture is obtained by mixing the metal oxide particles and the powdery metal acetylacetonate using a general mixing method performed, for example, in one or two or more kinds of solvents selected from the group consisting of water, acetylacetone, methanol and/or alcohol containing ethanol and the like, or in one or two or more kinds of gases selected from the group consisting of air, nitrogen and the like under atmospheric pressure.

The raw material mixture may be obtained by mixing metal oxide particles, metal acetylacetonate, and a solvent. As the solvent, any suitable solvent can be used, and for example, one or a mixture of two or more selected from the group consisting of water, acetylacetone, an alcohol containing methanol and/or ethanol, and the like may be used. The amount of the solvent only needs to be not too large to an extent suitable for subjecting the raw material mixture to heating under pressure, and is not particularly limited, and the solvent can be mixed at a ratio of, for example, 50% by mass or less, preferably 30% by mass or less with respect to the total mass of the metal oxide particles. Upon mixing, the metal acetylacetonate and the solvent may be used separately, or a liquid product in which the metal acetylacetonate is dispersed or dissolved in the solvent may be used. In the latter case, a liquid product obtained by synthesizing the metal acetylacetonate may be used without separating the metal acetylacetonate therefrom. More specifically, the metal acetylacetonate can be synthesized by mixing liquid acetylacetone with a metal compound (for example, metal hydroxides and chlorides), and the liquid product after synthesis can be used as it is, or by adding a solvent as necessary.

In addition to the metal oxide particles and the metal acetylacetonate, the raw material mixture may further contain any suitable material to the extent that the desired electrical characteristics are not adversely affected. More specifically, the raw material mixture may further contain additives such as a pH adjusting agent, a sintering aid, and a pressure relieving agent. These additives may be mixed at a ratio of, for example, 0.01% by mass to 10% by mass, and is mixed at a ratio of preferably 0.01% by mass to 1% by mass, and more preferably 0.01% by mass to 0.1% by mass, with respect to the total mass of the metal oxide particles.

The raw material mixture obtained as described above is heated under pressure at a temperature of the melting point of the metal acetylacetonate or higher and 600° C. or lower, whereby a relatively high-density sintered body can be formed. In this heating step, the metal acetylacetonate is liquefied and can act as a liquid medium. The heating is preferably performed in the presence of a fluid. In the present specification, the fluid is, for example, a liquid, preferably a liquid that can be used as a solvent, and more preferably water. For example, in a case where water exists when the raw material mixture is heated and pressurized, water exists at an interface of the metal oxide particles contained in the raw material mixture. As a result, the raw material mixture can be sintered at a lower temperature, and the strength of the sintered body can be effectively improved.

In the present specification, the state in which the mixture is in the presence of water means that water may not be actively added to the mixture and a slight amount of water may exist at the interface of the metal oxide particles. The metal oxide particles may absorb moisture at room temperature. The active addition of water may be performed by adding (mixing) water to the raw material mixture, or may be performed by heating and pressurizing the raw material mixture under a water vapor atmosphere. In particular, when water exists by being mixed with the raw material mixture, the water can be more effectively delivered through the interface of each particle. When water is mixed in the raw material mixture, the amount thereof is not particularly limited, and may be, for example, 20% by mass or less, is preferably 15% by mass or less, and is typically 10% by mass with respect to the total mass of the metal oxide particles. When the amount of water mixed in the raw material mixture is 20% by mass or less, water can be mixed with the raw material mixture, and deterioration of moldability of the raw material mixture can be more effectively prevented. In order to effectively improve the strength of the sintered body, it is preferable to use as much water as possible within the above range, specifically, water of 10% by mass to 20% by mass. In order to more easily perform molding, it is preferable to use as little water as possible within the above range, specifically, water of more than 0% by mass and 10% by mass or less.

The pressurization pressure of the raw material mixture may be, for example, 1 MPa to 5000 MPa, and is preferably 5 MPa to 1000 MPa, more preferably 10 MPa to 500 MPa. In the present specification, the pressurization of the raw material mixture means that a pressing force (or a physical/mechanical pressure) is applied to the raw material mixture (more specifically, a solid component contained in the raw material mixture) by using, for example, a pressure molding machine. Thus, it should be noted that when the raw material mixture is in a pressurized state, a liquid component contained in the raw material mixture is exposed to pressure (usually atmospheric pressure) of an ambient atmosphere.

The temperature at which the raw material mixture is heated (this temperature is hereinafter also referred to as the "heating temperature" in the present specification) refers to a firing temperature, and may be the temperature of the melting point of the metal acetylacetonate contained in the raw material mixture or higher and 600° C. or lower. In the present specification, the melting point refers to a temperature measured by a measurement method defined in JIS standard at room temperature and atmospheric pressure. Each melting point changes depending on various conditions such as a pressure at the time of pressurization. The melting points of various metal acetylacetonates are shown in Table 1 below. When two or more kinds of metal acetylacetonates are used, the "melting point of the metal acetylacetonate" refers to the highest melting point among the melting points of all the metal acetylacetonates. The heating temperature of the raw material mixture may be a temperature of higher by 5° C. or more than the melting point of the metal acetylacetonate and 600° C. or lower, for example, 100° C. or higher and 600° C. or lower, preferably 100° C. or higher and 400° C. or lower, and more preferably 100° C. or higher and 300° C. or lower, depending on the type of the metal oxide to be used and the like.

TABLE 1

| Metal acetylacetonate | Melting point (° C.) |
| --- | --- |
| Manganese acetylacetonate | 161 |
| Nickel acetylacetonate | 230 |
| Iron acetylacetonate | 185 |
| Aluminum acetylacetonate | 193 |
| Cobalt acetylacetonate | 198 |
| Copper acetylacetonate | 284 |

As described above, by heating the raw material mixture under pressure at a temperature of the melting point of the metal acetylacetonate or higher, a relatively high-density sintered body can be formed at a low temperature as described above. In the present specification, the relatively high density means that the ratio of the density to the theoretical density of the sintered body obtained thereby is higher than the ratio of the density to the theoretical density of the sintered body obtained when the metal oxide particles contained in the raw material mixture are heated and pressurized alone (without the presence of the metal acetylacetonate) at the same temperature under the same pressure conditions. The sintered body obtained according to the present embodiment may have a relatively high density, and the ratio of the density to the theoretical density may be, for example, 70% or more, preferably 80% or more, depending on the composition of the metal oxide particles to be used and the like. The metal oxide contained in the obtained sintered body may be considered to be substantially the same as the metal oxide of the metal oxide particles contained in the raw material mixture. Although a time for heating and pressurizing the raw material mixture can be appropriately selected, the time is preferably 1 second to 120 minutes.

As described above, the sintered body formed in contact with the electrode 13 (13a, 13b) using the raw material mixture containing the metal oxide particles and the metal acetylacetonate corresponds to the composite 10 containing the metal oxide particles 1 and the first amorphous phase 2 and the bonding layer 15 (15a, 15b) containing the second amorphous phase 12 as schematically shown in FIGS. 1(b)

and 2. The first amorphous phase 2 contains a metal element (the same metal element as the first metal element) derived from the metal acetylacetonate. The bonding layer 15 (second amorphous phase 12) contains the second metal element derived from the electrode 13 and the resin component derived from the base layer 27 in addition to the metal element (the same metal element as the first metal element) derived from the metal acetylacetonate.

In order to effectively form the bonding layer 15, the heat treatment is desirably performed under a condition that the resin component of the base layer 27 is slightly melted. For example, when a polyimide film is used as the base layer 27, it is preferable to perform the heat treatment by heating at 270° C. for 30 minutes under a pressure of 100 MPa using a heating press machine, and then annealing at 250° C. for 10 hours in order to remove unnecessary organic substances that may remain.

Thus, the thermistor 30 of the present embodiment can be manufactured.

Embodiment 2

The present embodiment relates to a thermistor in which two electrodes include a base material formed from a second metal element and a coating layer formed on a surface of the base material and formed from a third metal element.

Figure 4A:
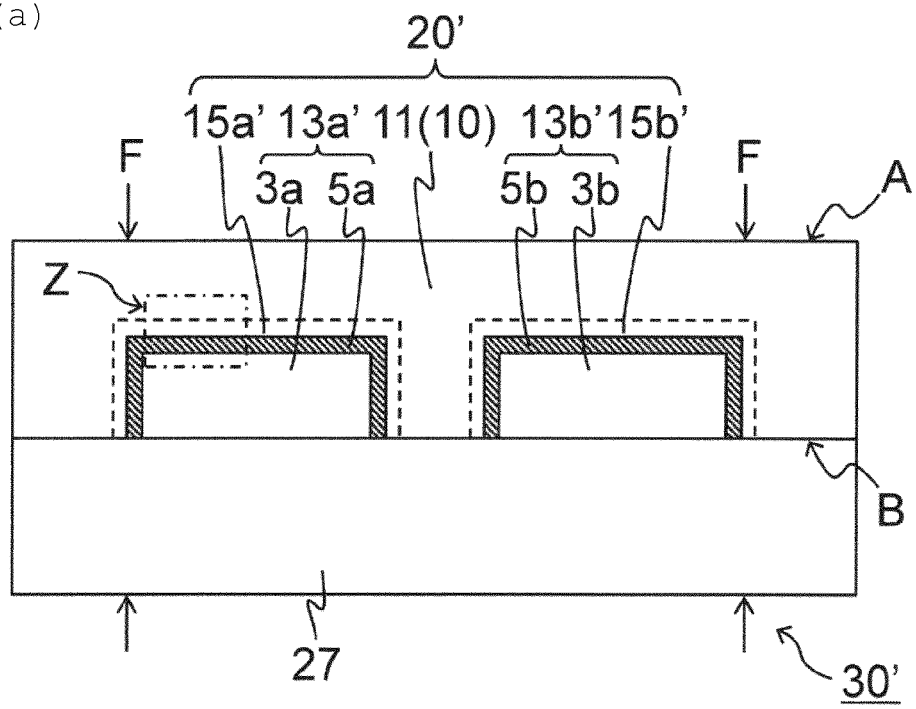

As shown in FIGS. 4(a) and 1(b), in a thermistor 30' in the present embodiment, a structure 20' including a thermistor layer 11 and two electrodes 13a' and 13b' (collectively referred to as reference numeral "13'") is disposed on a base layer 27.

The two electrodes 13a' and 13b' include base materials 3a and 3b (collectively referred to as reference numeral "3") including at least one second metal element selected from the group consisting of Cu, Al, Ag, and Ni, and coating layers 5a and 5b (collectively referred to as reference numeral "5") formed on the surface of the base material and including at least one third metal element selected from the group consisting of Ni, Au, Ag, Pt, Pd, Zn, Cr, W, Mo, Cu, and Ti. When the base material 3 is formed from two or more second metal elements, the base material 3 may be an alloy. The second metal element is preferably any one of or two or more of Ni, Cu, and Ag. When the coating layer 5 is formed from two or more third metal elements, the coating layer 5 may be an alloy or a laminate. The third metal element is a metal element different from the second metal element, and it is preferable that the resistance value (to the same extent as metal elements of the base material 3, for example, Cu and Ag) is low, the surface state is hardly changed, the diffusion amount is smaller than that of the metal element of the base material 3, and the diffusion of the metal element of the base material 3 can be prevented to some extent. The third metal element is preferably any one or two or more of Ni, Au, Ag, Pt, Pd, Zn, Cr, W, Mo, Cu, and Ti, and more preferably Au. The second metal element and the third metal element are inexpensive and easily available as compared with Ag—Pd (obtained by mixing and sintering Ag particles and Pd particles) as described in Patent Document 1. According to the present embodiment, it is possible not to use metal species that are expensive and poor in resources. The thickness of the coating layer 5 may be appropriately selected, and may be, for example, 0.1 to 1.0 μm.

According to the thermistor 30' of the present embodiment, high bonding strength can be obtained between the thermistor layer 11 (composite 10) and the electrodes 13a' and 13b'. In particular, when Au is used as the third metal element, initial electrical characteristics (resistance value and B constant) are improved and deterioration of electrical characteristics (increase in resistance value and change in B constant) under a high-temperature and high-humidity environment can be reduced as compared with the thermistor 30 of Embodiment 1.

Figure 4B:
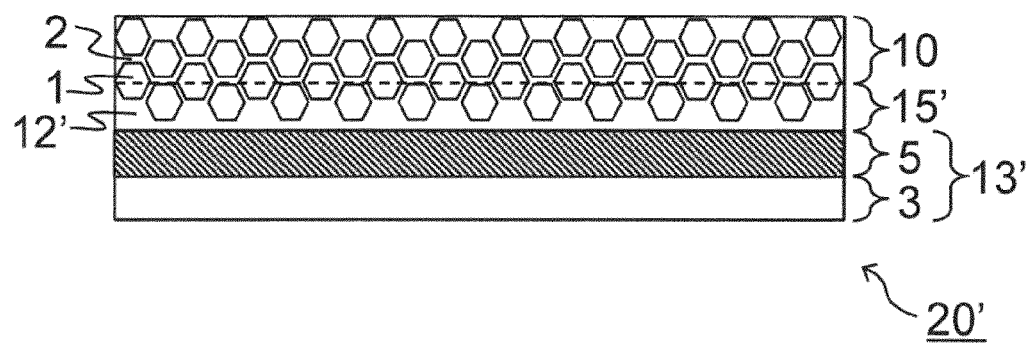

Without limiting the present embodiment, as shown in FIGS. 4(a) and 4(b), bonding layers 15a' and 15b' (collectively referred to as reference numeral "15'") may exist between the two electrodes 13a' and 13b' and the thermistor layer 11 (composite 10). The bonding layer 15' may be formed by diffusing the third metal element and the resin component and optionally the second metal element into the composite 10. In practice, a boundary between the composite 10 and the bonding layer 15' is not necessarily clear (in the accompanying drawings, a virtual boundary is indicated by a dotted line). In some cases, the composite 10 and the bonding layer 15 may be collectively understood as a metal oxide-containing composite layer or thermistor layer. The composite 10 between the electrodes 13a' and 13b', together with the bonding layers 15a' and 15b', can act as a thermistor layer whose resistance can vary depending on temperature (more specifically with a negative temperature coefficient).

More specifically, the bonding layer 15' is formed by diffusing the third metal element derived from the coating layer 5 and the resin component derived from the substrate 27 (and optionally the second metal element derived from the base material 3) into the composite 10 (including the metal oxide particles 1 and the first amorphous phase 2). The third metal element (and the second metal element if exists) can be diffused from the electrode 13' to the composite 10 by heat and dissolution (more specifically, dissolution of the metal element in metal acetylacetonate, which can occur during the application and heat treatment of a raw material mixture (mixture including metal oxide particles and metal acetylacetonate)) to form the bonding layer 15'. The resin component can be diffused from the substrate 27 to the composite 10 by heat and dissolution (more specifically, dissolution of the resin component in metal acetylacetonate, which can occur during the application and heat treatment of a raw material mixture) to form the bonding layer 15'. The third metal element (and the second metal element when exists) and the resin component may diffuse into either the metal oxide particles 1 or the first amorphous phase 2, and may diffuse more into the first amorphous phase 2 in most cases. Since the first amorphous phase 2 contains the same metal element as the first metal element as described above, it can also be understood that in the bonding layer 15', the second amorphous phase 12' contains the same metal element as the first metal element, the same metal element as the third metal element (and the same metal element as the second metal element when present), and the same element as the resin component (carbon element when the resin component contains carbon). The bonding layer 15' can be understood as a region in which the same metal element as the third metal element is distributed and the same element as the resin component (typically, carbon element) is distributed.

It is believed that due to the bonding layers 15a' and 15b' thus configured, high bonding strength can be obtained between the thermistor layer 11 (composite 10) and the electrodes 13a' and 13b'. In particular, when Au is used as the third metal element, it is considered that the presence of the third metal element derived from the coating layer 5 in the bonding layers 15a' and 15b' ensures conduction stability, the initial electrical characteristics (resistance value and B constant) are improved, and the deterioration of the electrical characteristics (increase in resistance value and change in B constant) under the high-temperature and high-humidity environment can be reduced.

In the thermistor 30 of the present embodiment, the bonding layer 15' (more specifically, the second amorphous phase 12') contains the same metal elements as the first metal element and the third metal element (and the second metal element when exists). In addition, the bonding layer 15' can exhibit electrical characteristics close to those of the metal oxide (semiconductor) particles 1 having a crystal structure. In addition, since the bonding layer 15' contains the same metal elements as the first metal element and the third metal element (and the second metal element when exists), electrical resistance (schematically, a Schottky barrier between the metal oxide (semiconductor) particles 1 and the electrode 13', more specifically, interface resistance between the metal oxide particles 1 and the second amorphous phase 12' and between the second amorphous phase 12' and the electrode 13') between the composite 10, the bonding layer 15', and the electrode 13' can be reduced, and the electrical characteristics of the thermistor 30' can be improved.

The same description as that of Embodiment 1 can be applied to the present embodiment.

The thermistor 30' of the present embodiment described above can be manufactured by any suitable method, and can be manufactured, for example, by the following method.

First, the base materials 3a and 3b formed from the second metal element are formed on the base layer 27. The base materials 3a and 3b can be pattern-formed by any suitable method such as photolithography, plating, vapor deposition, or sputtering. Then, the coating layers 5a and 5b formed from the third metal element are formed on the surfaces of the base materials 3 and 3b. The coating layers 5a and 5b can be formed by any suitable method such as plating. Thus, the electrodes 13a' and 13b' are formed.

Thereafter, a procedure similar to the method described in Embodiment 1 can be performed. In the present embodiment, although the bonding layer 15' is not essential, the bonding layer 15' (second amorphous phase 12') contains the third metal element derived from the electrode 13' (and the second metal element when exists) and the resin component derived from the base layer 27 in addition to the metal element (the same metal element as the first metal element) derived from the metal acetylacetonate.

Thus, the thermistor 30' of the present embodiment can be manufactured.

Alternatively, without limiting the present embodiment, when the thickness of the thermistor layer 11 is small, the bonding layers 15a' and 15b' and the thermistor layer 11 may not be distinguishable. In this case, the thermistor layer 11 may be formed by diffusing the third metal element and the resin component and optionally the second metal element into the composite 10.

EXAMPLES

Example 1

Example 1 relates to a thermistor provided with a pair of comb-shaped counter electrodes formed from Cu in the aspect described above in Embodiment 1.

Figure 5A:
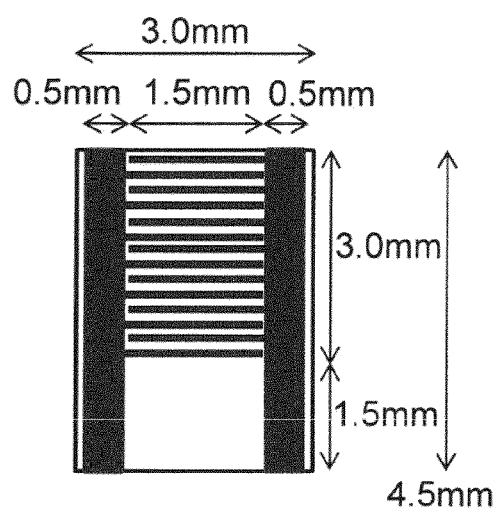
Figure 5B:
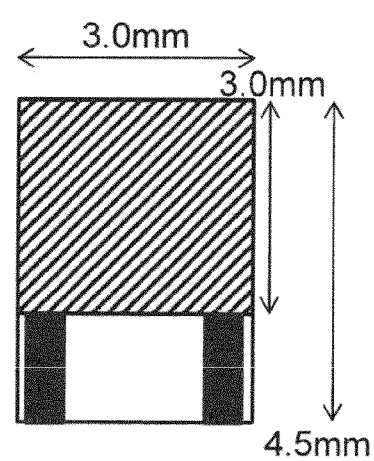

To metal oxide particles having an average particle diameter of about 0.2 µm and containing Mn:Ni:Co at a ratio of 3:1:2 (atomic ratio), manganese acetylacetonate was added at a ratio of 10% by mass (with respect to the total mass of the metal oxide particles), ethanol was added as a solvent, and the resultant mixture was mixed for 16 hours to obtain a raw material mixture in a slurry form. A Cu layer having a thickness of 10 µm was pattern-formed by photolithography on a base layer which was a polyimide film having a thickness of 10 µm, and the pair of comb-shaped counter electrodes was prepared together with an extraction electrode. The pair of comb-shaped counter electrodes had a total area dimension of 1.5 mm (dimension in a direction along a length direction of a tooth)×3.0 mm (dimension in a direction along a width direction of the tooth) as viewed from above, and the extraction electrode was formed on each of both outer sides of the pair of comb-shaped counter electrodes with 0.5 mm (dimension in the direction along the length direction of the tooth)×4.5 mm (dimension in the direction along the width direction of the tooth) (see FIG. 5(a)). The raw material mixture obtained above was supplied in the form of a sheet having a thickness of 15 µm by a doctor blade method onto an exposed surface of the electrode and the base layer to obtain a precursor laminate (see FIG. 5(b)). The precursor laminate was dried at 100° C. for 10 hours, then heated at 270° C. for 30 minutes under a pressure of 100 MPa using a heating press machine, and then annealed at 250° C. for 10 hours in order to remove unnecessary organic substances that may remain, thereby obtaining a laminate (thus, it was considered that the metal oxide-containing composite was formed together with the bonding layer). The obtained laminate was cut with a dicing saw to obtain a thermistor sample having a dimension of 3.0 mm×4.5 mm as viewed from the top and a total thickness of 30 µm as shown in FIGS. 5(a) to 5(b).

Figure 6A:
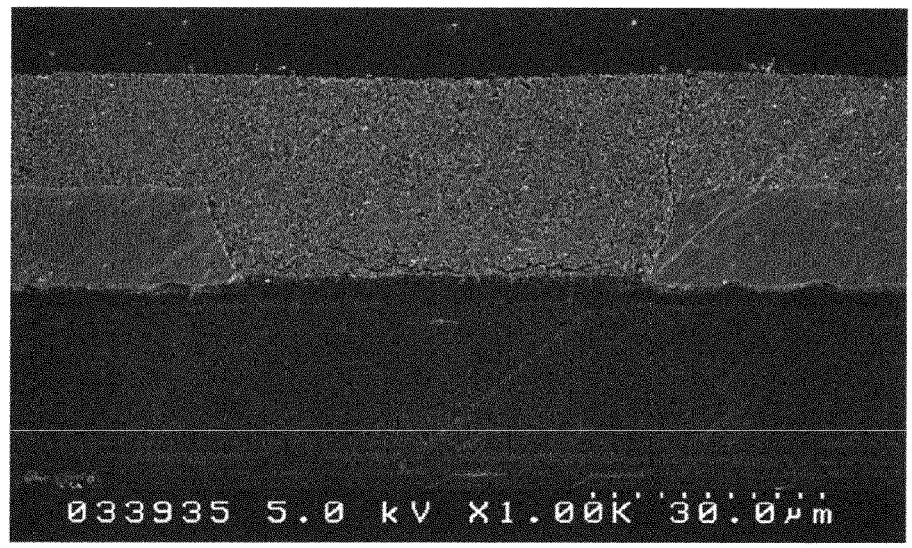
FIG. 6(a) is a field emission scanning electron microscope (FE-SEM) observation image of a section of the thermistor sample prepared in Example 1.

The thermistor sample of Example 1 obtained thereby was embedded in a resin, cut into two parts through the width direction of the teeth of the comb-shaped electrode, and the section was observed with a field emission scanning electron microscope (FE-SEM) observation. The results are shown in FIG. 6(a). From FIG. 6(a), it was confirmed that the lowermost layer was a polyimide base layer, two Cu electrodes were provided on the left and right sides on the polyimide base layer, and a thermistor layer of a metal oxide-containing composite was formed on the polyimide base layer and the two Cu electrodes (the layer above the thermistor layer was a resin used for embedding the sample).

Comparative Example 1

Comparative Example 1 related to an example in which a precursor of a thermistor layer was disposed on a base layer (metal substrate) formed from Cu or Ni and co-sintered, and an example in which a split electrode was formed thereon and an attempt was made to prepare a thermistor. It should be noted that in the thermistor of Patent Document 1, a gap is formed in the vertical direction (direction perpendicular to the main surface of the substrate) between the metal substrate and the comb-shaped counter electrode.

To metal oxide particles having an average particle diameter of about 0.2 µm and containing Mn:Ni:Co at a ratio of 3:1:2 (atomic ratio), an organic binder was added at a ratio of 10% by mass (with respect to the total mass of the metal oxide particles), ethanol was added as a solvent, and the resultant mixture was mixed for 16 hours to obtain a raw material mixture in a slurry form. The raw material mixture obtained above was supplied in the form of a sheet having a thickness of 15 µm by the doctor blade method onto a base layer which was a Cu foil or a Ni foil having a thickness of 20 µm to obtain a precursor laminate. The precursor laminate was housed in a zirconia box, heated at 300° C. for 100 hours in a nitrogen atmosphere to remove the organic binder, and then fired at 800 to 1300° C. for 60 minutes in a reducing atmosphere in the box to obtain a sintered body.

However, in Comparative Example 1, at the time of obtaining the sintered body, Cu or Ni of the Cu foil or the Ni foil (base layer) was oxidized/melted and peeled off, and therefore, the sample of the thermistor sample was stopped without forming a split electrode on the sintered body (thermistor layer).

Comparative Example 2

Comparative Example 2 related to a thermistor in which a metal oxide-containing composite capable of acting as a thermistor layer was prepared, a base layer containing a resin component was then formed, and a pair of comb-shaped counter electrodes formed from Cu was then provided.

To metal oxide particles having an average particle diameter of about 0.2 μm and containing Mn:Ni:Co at a ratio of 3:1:2 (atomic ratio), manganese acetylacetonate was added at a ratio of 20% by mass (with respect to the total mass of the metal oxide particles), ethanol was added as a solvent, and the resultant mixture was mixed for 16 hours to obtain a raw material mixture in a slurry form. The raw material mixture obtained above was supplied in the form of a sheet having a thickness of 15 μm by the doctor blade method onto a Cu foil having a thickness of 10 μm to obtain a precursor laminate. The precursor laminate was dried at 100° C. for 10 hours, then heated at 270° C. for 30 minutes under a pressure of 100 MPa using a heating press machine, and then annealed at 250° C. for 10 hours in order to remove unnecessary organic substances that may remain, thereby obtaining a laminate (thus, it was considered that the metal oxide-containing composite was formed). Thereafter, a precursor liquid of polyamideimide was applied in a thickness of 15 μm onto a film (metal oxide-containing composite capable of functioning as the thermistor layer) derived from the sheet in the obtained laminate, and heated at 250° C. for 1 hour to thermally cure the polyamideimide, and thus to form a resin substrate. Thereafter, a Cu foil on a side opposite to the resin substrate was pattern-formed by photolithography (more specifically, a photoresist was applied to the surface of the copper foil, exposed in a predetermined pattern, and developed, a predetermined portion of the Cu foil was etched and removed, and the remaining resist was removed), and the pair of comb-shaped counter electrodes was provided together with an extraction electrode in the same manner as in Example 1. The obtained laminate was cut with a dicing saw to obtain a thermistor sample having a dimension of 3.0 mm×4.5 mm as viewed from the top and a total thickness of 30 μm in the same manner as in Example 1.

Figure 6B:
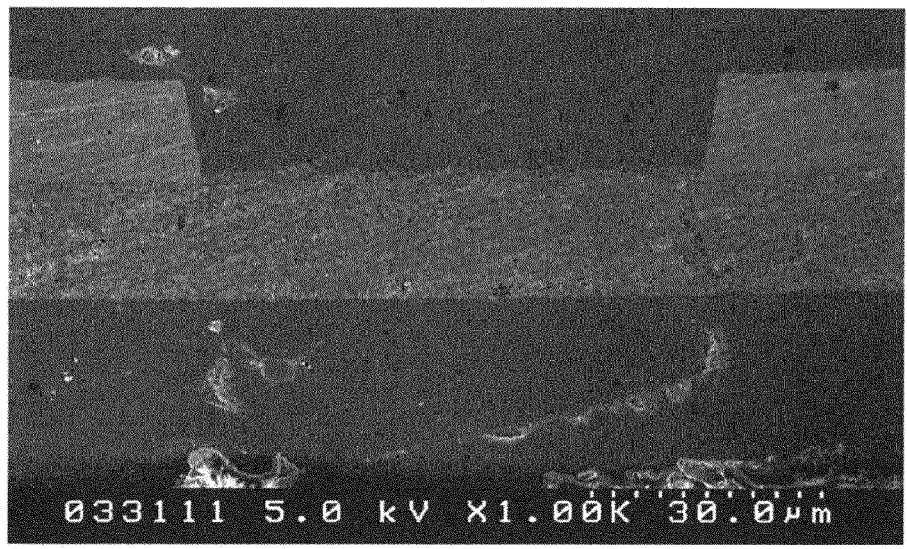
FIG. 6(b) is a field emission scanning electron microscope (FE-SEM) observation image of a section of the thermistor prepared in Comparative Example 2.

In the thermistor sample of Comparative Example 2 obtained thereby, the section was observed with a field emission scanning electron microscope (FE-SEM) observation in the same manner as in Example 1. The results are shown in FIG. 6(b). From FIG. 6(b), it was confirmed that the lowermost layer was a polyamideimide base layer, a thermistor layer of a metal oxide-containing composite was formed on the base layer was formed, and the two Cu electrodes were formed on the left and right sides on the thermistor layer (the layer above the two Cu electrodes and the thermistor layer was a resin used for embedding the sample).

Example 2

Example 2 relates to a thermistor provided with a pair of comb-shaped counter electrodes in which the base material made of Cu was covered with a coating layer formed from Ni in the aspect described above in Embodiment 2.

To metal oxide particles having an average particle diameter of about 0.2 μm and containing Mn:Ni:Co at a ratio of 3:1:2 (atomic ratio), manganese acetylacetonate was added at a ratio of 10% by mass (with respect to the total mass of the metal oxide particles), ethanol was added as a solvent, and the resultant mixture was mixed for 16 hours to obtain a raw material mixture in a slurry form. A Cu layer having a thickness of 10 μm was pattern-formed by photolithography on a base layer which was a polyimide film having a thickness of 10 μm to obtain a base material, a Ni layer having a thickness of 1 to 5 μm was further formed by plating treatment on the surface of the base material, and a pair of comb-shaped counter electrodes were produced together with an extraction electrode in the same dimension as in Example 1. The raw material mixture obtained above was supplied in the form of a sheet having a thickness of 15 μm by a doctor blade method onto an exposed surface of the electrode and the base layer to obtain a precursor laminate. The precursor laminate was dried at 100° C. for 10 hours, then heated at 270° C. for 30 minutes under a pressure of 100 MPa using a heating press machine, and then annealed at 250° C. for 10 hours in order to remove unnecessary organic substances that may remain, thereby obtaining a laminate (thus, it was considered that the metal oxide-containing composite was preferably formed together with the bonding layer). The obtained laminate was cut with a dicing saw to obtain a thermistor sample having the same dimensions and total thickness as in Example 1 when viewed from above.

Example 3

Example 3 was a modification of Example 2 and related to a thermistor provided with a pair of comb-shaped counter electrodes in which a base material made of Cu was covered with a coating layer formed from Au.

To metal oxide particles having an average particle diameter of about 0.2 μm and containing Mn:Ni:Co at a ratio of 3:1:2 (atomic ratio), manganese acetylacetonate was added at a ratio of 10% by mass (with respect to the total mass of the metal oxide particles), ethanol was added as a solvent, and the resultant mixture was mixed for 16 hours to obtain a raw material mixture in a slurry form. A Cu layer having a thickness of 10 μm was pattern-formed by photolithography on a base layer which was a polyimide film having a thickness of 10 μm to obtain a base material, an Au layer having a thickness of 0.1 to 0.5 μm was further formed by plating treatment on the surface of the base material, and a pair of comb-shaped counter electrodes were produced together with an extraction electrode in the same dimension as in Example 1. The raw material mixture obtained above was supplied in the form of a sheet having a thickness of 15 μm by a doctor blade method onto an exposed surface of the electrode and the base layer to obtain a precursor laminate. The precursor laminate was dried at 100° C. for 10 hours, then heated at 270° C. for 30 minutes under a pressure of 100 MPa using a heating press machine, and then annealed at 250° C. for 10 hours in order to remove unnecessary organic substances that may remain, thereby obtaining a laminate (thus, it was considered that the metal oxide-containing composite was preferably formed together with the bonding layer). The obtained laminate was cut with a dicing saw to obtain a thermistor sample having the same dimensions and total thickness as in Example 1 when viewed from above.
(Evaluation)

The thermistor samples prepared in Examples 1 to 3 and Comparative Example 2 were evaluated as follows.

Bonding Strength (Adhesiveness)

Two thermistor samples were prepared for each of Examples 1 to 3 and Comparative Example 2, and the bonding strength (adhesiveness) was evaluated. This evaluation was performed in accordance with a cross-cut method defined in JIS K 5600-5-6. The evaluation results were classified as follows.

0: The edges of the cuts were perfectly smooth; none of the squares of the lattice was detached.
1: Detachment of small flakes of the coating was seen at the intersections of the cuts. A cross-cut area of not greater than 5% apparently was affected.
2: The coating flaked along the cut edges and/or at the intersections of the cuts. The cross-cut area of greater than 5% apparently, but not greater than 15%, was affected.
3: The coating flaked along the cut edges partly or wholly in large ribbons, and/or it flaked partly or wholly on different parts of the squares. A cross-cut area of greater than 15% apparently, but not greater than 35%, was affected.
4: The coating flaked along the cut edges partly or wholly in large ribbons and/or some squares detached partly or wholly. A cross-cut area of not greater than 65% apparently was affected.
5: Any degree of flaking that could not be classified in Classification 4.

The evaluation results of the bonding strength (adhesiveness) of the thermistor samples of Examples 1 to 3 were all classified as Classification 0. Specifically, no peeling was observed between the two electrodes and the metal oxide-containing composite layer. On the other hand, Comparative Example 2 was classified as Classification 1. Specifically, only very slight peeling was observed between the two electrodes and the metal oxide-containing composite layer.

In the thermistor sample of Examples 1 to 3, since the precursor (raw material mixture) of the thermistor layer is subjected to heating at 270° C. and subsequent annealing at 250° C. (co-sintered) together with the polyimide base layer and the Cu electrode, the resin component (detected as element C) of the base layer is diffused into the metal oxide-containing composite by heat and dissolution (dissolution in metal acetylacetonate), and Cu of the electrode is diffused into the metal oxide-containing composite by heat and dissolution (dissolution in metal acetylacetonate), whereby the bonding layer formed between the electrode and the thermistor layer becomes one in which the resin component derived from the base layer and Cu derived from the electrode are diffused into the metal oxide-containing composite. The element C detected in the thermistors sample of Examples 1 to 3 may be considered to be derived from the resin component. In the annealing at 250° C. to remove the unnecessary organic substances that may remain, the temperature is equal to or higher than a decomposition temperature of the metal acetylacetonate, the element C derived from the metal acetylacetonate is substantially absent or very little when exists. In addition, since a large amount of C element detected in the thermistor sample of Examples 1 to 3 is distributed in the bonding layer close to the base layer, it can be inferred that the C element is derived from the resin component of the base layer. This is because the element C derived from the metal acetylacetonate should be uniformly distributed in the thermistor layer. On the other hand, in the thermistor sample of Comparative Example 2, since the precursor (raw material mixture) of the thermistor layer was subjected to heating at 270° C. and subsequent annealing at 250° C. (co-sintered) together with the Cu foil (finally becoming the Cu electrode), it is assumed that Cu of the Cu foil is diffused into the metal oxide-containing composite by heat and dissolution (dissolution in the metal acetylacetonate), whereby the bonding layer formed between the electrode and the thermistor layer becomes one in which Cu is diffused into the metal oxide-containing composite. However, since the base layer is then formed by thermal curing, the resin component of the base layer cannot be dissolved (dissolved in the metal acetylacetonate), and it is considered that the bonding layer that can exist between the thermistor layer and the Cu electrode does not contain the resin component of the base layer. It is considered that due to such a difference, the thermistor samples of Examples 1 to 3 provide higher bonding strength (adhesiveness) than the thermistor sample of Comparative Example 2.

Diffusion of the metal element and the resin component in the thermistor sample was confirmed as follows.

The thermistor samples of Examples 1 to 3 and Comparative Example 2 were cut into two parts through the width direction of the teeth of the comb-shaped electrode, and a sectional piece was cut out by a focused ion beam (FIB) and observed with scanning transmission electron microscope (STEM, JEOL JEM-F 200) observation. The observation site was subjected to energy dispersive X-ray analysis (EDX, Noran system 7) to identify an element existing from intensity at each applied voltage. For example, the C element could be identified from the peak around 0.2 eV, the Cu element could be identified from the peak around 1.0 eV, and the diffusion of each element could be confirmed.

Strength Test (Pressure Resistance)

The thermistor samples of Example 1 and Comparative Example 2 were subjected to a strength test (pressure resistance). More specifically, the thermistor sample was sandwiched between disk-shaped iron jigs having a diameter of 50 mm and a thickness of 25 mm, and pressurization at 0.5 tons was repeated five times to confirm a change in the measured resistance value. During the measurement of the resistance value, a load (pressure) was measured by sandwiching a pressure-sensitive film Prescale for intermediate pressure (detection sensitivity: 10 MPa) manufactured by FUJIFILM Corporation between the surface of the thermistor sample opposite to the substrate and the iron jig, and a load distribution was examined.

In the thermistor sample of Example 1, a rate of change in resistance value (the resistance value at the same temperature without pressurization was used as a reference) at the time of pressurization was 3% or less. Under pressure, an error of 1° C. or less as a temperature sensor could be realized. During the measurement of the resistance value, the load (pressure) measurement with the pressure-sensitive film confirmed that the load was applied not only to the region where the electrode existed but also to the entire surface of the thermistor sample. Considering that the region where the electrode exists occupies about 30% of the entire area of the sample, it is considered that the load applied to the electrode is reduced to about ⅓ by uniformly dispersing the load in the entire area, and as a result, the rate of change in the resistance value can be reduced.

In the thermistor sample of Comparative Example 2, the rate of change in the resistance value in the resistance value measurement of the first pressurization was 5% or more, and thereafter, the rate of change in the resistance value increased with the number of times. The load (pressure) measurement with the pressure-sensitive film confirmed that the load was concentrated only in the region where the electrode of the thermistor sample existed, and in particular, the load was biased in a region corresponding to a corner portion of the electrode. In addition, when the thermistor sample after the measurement was observed, it was confirmed that the electrode was buried in the thermistor layer and the thermistor layer was cracked.

Initial Electrical Characteristics (Resistance Value and B Constant)

Ten thermistor samples were prepared for each of Examples 1 to 3, and the initial electrical characteristics (resistance value and B constant) were evaluated. More specifically, regarding the resistance value, an average value of resistance values (Ω) measured twice at 25° C. for one thermistor sample was defined as a resistance value of the thermistor sample, and the average value, standard deviation, maximum value, and minimum value of the resistance values (Ω) of the ten thermistor samples for each Example were calculated. The results are shown in Table 2. For the B constant, the B constant (-) of one thermistor sample was calculated using the resistance values (Ω) measured at 25° C. and 35° C., and the average value, standard deviation, maximum value, and minimum value of the B constants of ten thermistor samples were calculated for each Example. The results are shown in Table 3.

TABLE 2

| | Resistance value (Ω) | | |
| --- | --- | --- | --- |
| | Example 1 | Example 2 | Example 3 |
| Average value | 420848 | 3212929 | 49992 |
| Standard deviation | 394949 | 2634100 | 28025 |
| Maximum value | 1309787 | 7249832 | 115666 |
| Minimum value | 154294 | 334317 | 27199 |

TABLE 3

| | B constant | | |
| --- | --- | --- | --- |
| | Example 1 | Example 2 | Example 3 |
| Average value | 3884 | 3556 | 3771 |
| Standard deviation | 112 | 295 | 23 |
| Maximum value | 4058 | 4056 | 3806 |
| Minimum value | 3707 | 3159 | 3729 |

As shown in Table 2, the resistance value (average value) was smaller and the variation (standard deviation) was also smaller in Example 3 than in Examples 1 and 2. As shown in Table 3, in Example 3 as compared with Examples 1 and 2, the B constant (average value) close to the B constant of the powder (referred to as the B constant in a metal oxide sintered body (simple substance) obtained by sintering metal oxide particles having the same metal ratio as in Example at a temperature of 1000° C. or higher, and was specifically 3700; the same applied to the following) was obtained, and the variation (standard deviation) was also small.

In Example 1, it is presumed that Cu of the Cu electrode is diffused into the metal oxide-containing composite at the time of heating and pressurization, and the initial resistance value is not as low as that in Example 3 due to the formed bonding layer. In Example 2, it is presumed that Cu and Ni of the Cu base material and Ni of the coating layer are diffused into the metal oxide-containing composite at the time of heating and pressurization, and the initial resistance value is not as low as that in Example 3 due to the formed bonding layer. On the other hand, it is presumed that in Example 3, Au in the Au coating layer has a sufficiently low resistance value, the surface state is hardly changed at the time of heating and pressurization, and diffusion of Cu in the Cu base material into the metal oxide-containing composite can be prevented to some extent, so that a sufficiently low resistance value is obtained, and the B constant (average value) close to the B constant (3700) of the powder is obtained.

Change (Resistance Value Change Rate and B Constant Change Rate) in Electrical Characteristics Under the High-Temperature and High-Humidity Environment Ten thermistor samples were prepared for each of Examples 1 to 3, and subjected to a high-temperature and high-humidity environment test to examine a rate of change in electrical characteristics (resistance value and B constant). More specifically, all thermistor samples were allowed to stand for 24 hours in a high-temperature and high-humidity environment at a temperature of 60° C. and a humidity of 95% with a small environmental tester, and then the resistance value (Ω) and the B constant (-) were calculated in the same manner as described above. For each thermistor sample, the resistance value change rate (%) based on the initial resistance value (Ω) was calculated, and the average value, standard deviation, maximum value, and minimum value of the resistance value change rates of ten thermistor samples for each Example were calculated. The results are shown in Table 4. For each thermistor sample, the B constant change rate (%) based on the initial B constant (-) was calculated, and the average value, standard deviation, maximum value, and minimum value of B constant change rates of ten thermistor samples for each Example were calculated. The results are shown in Table 5.

TABLE 4

| | Resistance value change rate (%) | | |
| --- | --- | --- | --- |
| | Example 1 | Example 2 | Example 3 |
| Average value | 43 | 31 | 5 |
| Standard deviation | 22 | 10 | 3 |
| Maximum value | 92 | 53 | 9 |
| Minimum value | 18 | 15 | 1 |

TABLE 5

| | B constant change rate (%) | | |
| --- | --- | --- | --- |
| | Example 1 | Example 2 | Example 3 |
| Average value | 0.9 | -2.3 | -0.2 |
| Standard deviation | 3.3 | 2.9 | 1.4 |
| Maximum value | 4 | 3 | 2 |
| Minimum value | -6 | -7 | -3 |

Referring to Table 4, the resistance value increased after the high-temperature and high-humidity environment test in all thermistor samples (the minimum value was a positive value). Referring to Table 5, the B constant increased or decreased after the high-temperature and high-humidity environment test (the minimum value was a negative value). As shown in Table 2, the resistance value change rate and the B constant change rate (average value) were smaller and the variations (standard deviations) thereof were also smaller in Example 3 than in Examples 1 and 2. That is, in Example 3, a thermistor having little change in electrical characteristics when exposed to the high-temperature and high-humidity environment could be obtained.

In Example 1, it is presumed that Cu of the Cu electrode is diffused into the metal oxide-containing composite at the time of heating and pressurization, and the rate of change in the resistance value and the B constant under the high-temperature and high-humidity environment is larger than that in Example 3 due to the formed bonding layer. In Example 2, it is presumed that Cu and Ni of the Cu base material and Ni of the coating layer are diffused into the metal oxide-containing composite at the time of heating and pressurization, and the rate of change in the resistance value and the B constant under the high-temperature and high-humidity environment is larger than that in Example 3 due to the formed bonding layer. On the other hand, it is presumed that in Example 3, Au in the Au coating layer has a sufficiently low resistance value, the surface state is hardly changed at the time of heating and pressurization, and diffusion of Cu in the Cu base material into the metal oxide-containing composite can be prevented to some extent, so that the rate of change in the resistance value and the B constant under the high-temperature and high-humidity environment can be remarkably reduced.

The thermistor of the present invention can be used in a wide variety of applications such as a temperature sensor. For example, when the thermistor of the present invention is flexibly configured as a whole, the thermistor can be used as a flexible temperature sensor, for example, in applications such as temperature measurement for temperature management of in-vehicle batteries and batteries for smart phones in which firing or deterioration at high temperatures is a problem, and body temperature measurement in the medical and healthcare fields. However, the thermistor of the present invention is not limited to such an application.

DESCRIPTION OF REFERENCE SYMBOLS

1: Particle (metal oxide particle)
2: Amorphous phase (first amorphous phase)
3, 3a, 3b: Base material
5, 5a, 5b: Coating layer
10: Composite (metal oxide-containing composite)
11: Thermistor layer
12, 12': Amorphous phase (second amorphous phase)
13, 13a, 13b, 13', 13a', 13b': Electrode
14a, 14b: External electrode
15, 15a, 15b, 15', 15a', 15b': Bonding layer
20, 20': Structure
27: Base layer (resin substrate)
30, 30': Thermistor

The invention claimed is:

1. A thermistor comprising:
a base layer containing a resin component;
a thermistor layer on the base layer, wherein the thermistor layer is a composite which includes a plurality of particles including a metal oxide containing at least one first metal element that is at least one of Mn and Ni, and an amorphous phase between the plurality of particles and which contains the same metal element as the first metal element;
two electrodes, wherein the two electrodes include at least one second metal element selected from the group consisting of Cu, Al, Ag, and Ni; and
a bonding layer between the two electrodes and the thermistor layer, the bonding layer comprising the composite, the second metal element, and the resin component.

2. The thermistor according to claim 1, wherein a structure comprising the thermistor layer and the two electrodes defines two surfaces that face each other, and the two surfaces have irregularities smaller than a thickness of the two electrodes or the two surfaces are flat.

3. The thermistor according to claim 1, wherein the two electrodes are arranged on the base layer and spaced apart from each other, and the thermistor layer is disposed on the two electrodes and the base layer.

4. The thermistor according to claim 1, wherein the first metal element further includes at least one selected from the group consisting of Fe, Al, Co, and Cu.

5. The thermistor according to claim 1, wherein the resin component contains at least one selected from the group consisting of polyethylene terephthalate, polyetherimide, polyamideimide, polyimide, polytetrafluoroethylene, an epoxy resin, and a liquid crystal polymer.

6. The thermistor according to claim 1, wherein an average particle size of the metal oxide particles is 0.01 μm to 100 μm.

7. The thermistor according to claim 1, wherein a content of silicon oxide in the composite is 0.1% by mass or less.

8. A thermistor comprising:
a base layer containing a resin component;
a thermistor layer on the base layer, wherein the thermistor layer comprises a composite which includes a plurality of particles including a metal oxide containing at least one first metal element that is at least one of Mn and Ni, and an amorphous phase between the plurality of particles and contains the same metal element as the first metal element;
two electrodes, wherein the two electrodes include a base material including at least one second metal element selected from the group consisting of Cu, Al, Ag, and Ni; and
a coating layer on a surface of the base material, the coating layer including at least one third metal element selected from the group consisting of Ni, Au, Ag, Pt, Pd, Zn, Cr, W, Mo, Cu, and Ti.

9. The thermistor according to claim 8, further comprising a bonding layer between the two electrodes and the thermistor layer, the bonding layer comprising the composite, the third metal element, and the resin component.

10. The thermistor according to claim 8, further comprising a bonding layer between the two electrodes and the thermistor layer, the bonding layer comprising the composite, the second metal element, the third metal element, and the resin component.

11. The thermistor according to claim 8, wherein a structure comprising the thermistor layer and the two electrodes defines two surfaces that face each other, and the two surfaces have irregularities smaller than a thickness of the two electrodes or the two surfaces are flat.

12. The thermistor according to claim 8, wherein the two electrodes are arranged on the base layer and spaced apart from each other, and the thermistor layer is disposed on the two electrodes and the base layer.

13. The thermistor according to claim 8, wherein the first metal element further includes at least one selected from the group consisting of Fe, Al, Co, and Cu.

14. The thermistor according to claim 8, wherein the resin component contains at least one selected from the group consisting of polyethylene terephthalate, polyetherimide, polyamideimide, polyimide, polytetrafluoroethylene, an epoxy resin, and a liquid crystal polymer.

15. The thermistor according to claim 8, wherein an average particle size of the metal oxide particles is 0.01 μm to 100 μm.

16. The thermistor according to claim 8, wherein a content of silicon oxide in the composite is 0.1% by mass or less.

17. The thermistor according to claim 8, wherein a thickness of the coating layer is 0.1 to 1.0 μm.

* * * * *